United States Patent [19]

Ibbotson et al.

[11] Patent Number: 5,653,894
[45] Date of Patent: Aug. 5, 1997

[54] ACTIVE NEURAL NETWORK DETERMINATION OF ENDPOINT IN A PLASMA ETCH PROCESS

[75] Inventors: Dale Edward Ibbotson, Bridgewater, N.J.; Tseng-Chung Lee, New York, N.Y.; Helen Louise Maynard, Summit, N.J.; Edward Alois Rietman, Madison, N.J.

[73] Assignee: Lucent Technologies Inc., Murray Hill, N.J.

[21] Appl. No.: 446,122

[22] Filed: May 19, 1995

Related U.S. Application Data

[63] Continuation-in-part of Ser. No. 150,261, Nov. 17, 1993, Pat. No. 5,467,883, which is a continuation-in-part of Ser. No. 990,308, Dec. 14, 1992, abandoned.

[51] Int. Cl.$^6$ .............................. G01N 21/00; H05H 1/00
[52] U.S. Cl. ........................ 216/59; 216/60; 156/626.1; 438/9; 364/468.28
[58] Field of Search .................... 216/59, 60; 156/626.1; 204/192.33

[56] References Cited

U.S. PATENT DOCUMENTS

| | | | |
|---|---|---|---|
| 5,114,233 | 5/1992 | Clark | 356/354 |
| 5,286,947 | 2/1994 | Diana | 219/121.83 |

OTHER PUBLICATIONS

"Neural Networks for Control," edited by W. Thomas Miller, III, Richard S. Sutton, and Paul J. Werbos, A. Bradford Book, MIT Press (1990).

S.M. Weiss et al., "Computer Systems That Learn: Classification and Prediction Methods from Statistics, Neural Nets, Machine Learning, and Expert Sytems," 12,13,54–68, Mogan Kaufmann Publishers, Inc. (1991).

Panel on Plasma Processing of Materials, "Plasma Processing of Materials: Scientific Opportunities and Technological Challanges," 6, 13–36, National Academy Press, Washington, DC (1991).

R.G. Poulsen, "Plasma Etching in Integrated Circuit Manufacture —A Review," J. Vac. Sci. Technol., 266–274, vol. 14, No. 1 (Jan./Feb. 1977).

J. Denker et al., "Large Automatic Learning, Rule Extraction and Generalization," Complex Systems 1, 877–922 (1987).

B. Widrow et al.,"30 Years of Adaptive Neural Networks: Perception, Madaline, and Backpropagation," Proceedings of the IEEE, 1415–1442, vol. 78, No. 9 (Sep. 1990).

D. E. Rumelhart et al., "Parallel Distributed Processing: Exploration in the Microstructure of Cognition (vol. 1; Foundations)," A Bradford Book, 318–330, The MIT Press (1986).

E. A. Rietman et al., "Neural Networks That Learn," Algorithm —The Personal Programming Newsletter, 17–21, (May/Jun. 1990).

K. Honik et al., "Universal Approximation of an Unknown Mapping and Its Derivatives Using Multilayer Feedforward Networks," Neural Networks, 551–560, vol. 3 (1990).

R. R. Bowman et al., "Practical Integrated Circuit Fabrication," Section 9 —Dry Etching, Integrated Circuit Engineering Corporation, 9–1 through 9–10 (1984).

(List continued on next page.)

*Primary Examiner*—Thi Dang
*Attorney, Agent, or Firm*—Richard J. Botos

[57] ABSTRACT

The present invention is predicated upon the fact that a process signature from a plasma process used in fabricating integrated circuits contains information about phenomena which cause variations in the fabrication process such as age of the plasma reactor, densities of the wafers exposed to the plasma, chemistry of the plasma, and concentration of the remaining material. In accordance with the present invention, a method for using neural networks to determine plasma etch end-point times in an integrated circuit fabrication process is disclosed. The end-point time is based on in-situ monitoring of at least two parameters during the plasma etch process. After the neural network is trained to associate a certain condition or set of conditions with the endpoint of the process, the neural network is used to control the process.

5 Claims, 2 Drawing Sheets

OTHER PUBLICATIONS

A. K. Dewdney, "Computer Recreations," Algorithm, 3,4, 11–15 (Oct. 1992). C. Barnes et al., Applications of Neural Networks to Process Control and Modeling, Artificial Neural Networks, 321–326, vol. 1 (Jun. 1991), K.K. Schnelle et al., A Real–Time Export System For Quality Control, IEEE Expert, 36–42 (1992).

C. D. Himmell et al., "A Comparison of Statisically–Based and Neural Network Models of Plasma Etch Behavior;" IEEE/SEMI Intl. Semiconductor Manufacturing Science Symposium, 124–129 (Jun. 15–16 1992).

R. Shadmehr et al., "Principle Component Analysis of Optical Emission Spectroscopy and Mass Spectrometry: Application to Reactive Ion Etch Process Parameter Estimation Using Neural Networks," J. Electrochem. Soc., vol. 139, No. 3, 907–914 (Mar. 1992).

T. Kohonen et al., "Artificial Neural Networks," Proc. of the 1991 Intl. Conf. on Artificial Neural Networks (ICANN–91) Espoo, Finland, 24–28 (Jun. 1991).

E. A. Rietman et al., "Active Neural Network Control of Wafer Attributes in a Plasma Etch Process," J. Vac. Sci. Technol. B 11(4), 1314–1316 (Jul./Aug. 1993).

K. D. Schenelle et al., "A Real–Time Expert System For Quality Control," IEEE Expert, 36–42 (1992).

ACTIVE NEURAL NETWORK DETERMINATION OF ENDPOINT IN A PLASMA ETCH PROCESS

RELATED APPLICATION INFORMATION

This application is a continuation-in-part of U.S. patent application Ser. No. 08/150,261, filed Nov. 17, 1993, now U.S. Pat. No. 5,467,883 which is a continuation-in-part of U.S. patent application Ser. No. 07/990,308, filed Dec. 14, 1992, which is now abandoned, and which is hereby incorporated by reference.

TECHNICAL FIELD

This invention relates to a method for use of neural networks to regulate control variables and materials in manufacturing processes such as those employing plasmas.

BACKGROUND OF THE INVENTION

Plasma processes are important in the aerospace, solar energy, paper, textile industries as well as in the electronics industry for the fabrication of integrated circuits and optoelectronic devices. See National Research Council, *Plasma Processing of Materials*, National Academy Press, Washington, D.C., 1991. For example, plasmas are used both to etch and to deposit thin film layers on integrated circuit substrates.

A plasma is an ionized gas in which concentrations of positive and negative ions are almost equal. The plasma may also contain free radicals which are electrically neutral yet highly reactive. A plasma is formed by introducing a desired gas into a reactor or chamber and applying a radio frequency (RF) field to the chamber. The gas introduced is typically chosen to participate in the chemistry of the desired process, as for example chlorine gas in etching polysilicon in the fabrication of integrated circuits. The RF field causes electron collisions with neutral or charged species which then emit radiation producing a glow-discharge or emission.

Plasma etching is the selective removal of material by the reactive free radicals or ions generated within the plasma. In many cases, the plasma etching process is superior to wet etching techniques (where material is etched by liquid chemicals) in terms of exactness of the etching and process control. See generally, R. G. Poulsen, "Plasma Etching in Integrated Circuit Manufacture — A Review," *J. Vac. Sci. Tech.*, Vol. 14, No. 1,266–274 (January/February 1977).

Plasma processes are generally difficult to control. See, e.g., National Research Council at 34–35. For example, the plasma etching process must be continuously monitored to compensate for variations. One cause of variation in the process is the aging of the reactor. The etch time for a freshly cleaned reactor chamber is different than the etch time for a reactor that has been in production use for a time. Also, wafers having different pattern densities etch differently. Such changes necessitate continual inspection to maintain the quality of the product. Based on the inspection results, a decision is made for the etch time for the next lot. However, the requirement for continuous human intervention to account for the effects of machine aging and cleaning leads to run-to-ran variations in wafer attributes or characteristics between lots. Thus, there is a need for an accurate control mechanism to adjust the etch times between lots without continuous human intervention.

SUMMARY OF THE INVENTION

The present invention uses neural networks to govern or regulate input control variables and materials used in manufacturing processes to yield an output product with desired quality attributes. The method is particularly useful in controlling plasma processes, and it avoids many of the costs, delays and inconsistencies associated with prior methods. In the preferred embodiment, a neural network controller monitors at least two process variables that vary over time during the etch process. The neural network is trained to associate certain parameters with process endpoint. When the neural network observes the parameters or combination of parameters that it has been trained to associate with process endpoint, the neural network makes the appropriate change in response to the observed process conditions. This change can be a modification to the gas composition, a change in the RF power, or turning off the RF power. The process variables that are monitored according to the process of the present invention are any of the process parameters from which the neural network is capable of detecting endpoint. In one embodiment, the neural network is trained to monitor certain RF variables of the plasma process. These variables include capacitance, voltage, current, power density, forward and reflected power and other signatures of the RF process. The neural network is trained to associate certain conditions, or a combination of conditions, with process endpoint. In this regard, it is contemplated that any combination of process signatures may be monitored by the neural network.

Diagnostics that analyze the plasma, the sample, or the etching tool can be analyzed by the neural network to determine process endpoint once the neural network is trained to associate process endpoint with a condition or a set of conditions from these diagnostics. For example, plasma diagnostics such as quadrapole mass spectrometry, plasma induced optical emission, absorption spectroscopies, and Langmuir probes (a class of probes that monitors the electrical characteristics of the plasma) are generated during the etching process and transmitted to the neural network. The neural network has been previously trained to associate a condition or a set of conditions from one or more of these diagnostics with process endpoint. Once the neural network observes the conditions or set of conditions it associates with endpoint, it sends a signal to the process to effect an appropriate response (e.g., turning off the gas flow to the plasma, changing the plasma composition). Similarly wafer diagnostics and tool diagnostics are also useful in the process of the present invention. Wafer diagnostics such as thin film interferometry and ellipsometry are useful in this regard. Examples of suitable tool diagnostics include monitoring the position of the throttle valve that is used to control the pressure of the plasma, monitoring the neutral pressure of the plasma and monitoring the RF parameters previously discussed. Any combination of these diagnostics can be observed to practice the process of the present invention. The diagnostic or combination of diagnostics chosen should provide some information about the endpoint of the process. For example, if a particular diagnostic trace does not exhibit an observable change at process endpoint, that particular trace is not useful in monitoring that particular process. However, useful diagnostics may change depending upon the process conditions. That is why it is advantageous to use more than one diagnostic to monitor the process.

It is advantageous if the time of the process is also monitored. By monitoring the time, the process can be turned off after a certain amount of time if the neural network fails to observe endpoint before the certain amount of time has elapsed. An automated etch time control process offers advantages in terms of greater uniformity, higher yields and lower costs.

BRIEF DESCRIPTION OF THE DRAWINGS

Other features and advantages of the invention will become apparent from the following detailed description taken together with the drawings in which.

DETAILED DESCRIPTION

I. Introduction

Figure 1:
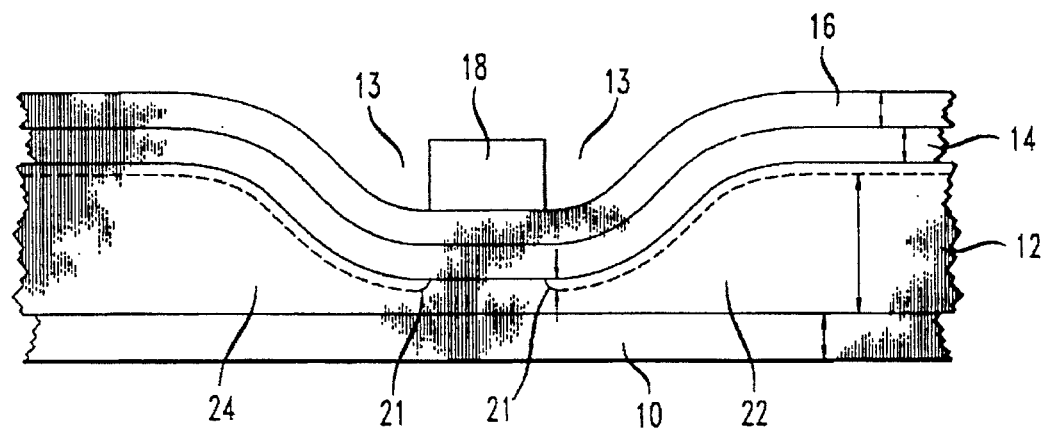
FIG. 1 illustrates a plasma etching step in fabricating an integrated circuit.

FIG. 1 illustrates typical use of the plasma etching process as one step in fabricating a MOS transistor. Silicon wafer substrate 10 is covered by oxide layer 12. Oxide layer 12 is then covered with polysilicon layer 14 and titanium nitride (TiN) 16. Oxide layer 12, typically silicon dioxide, has a well 13 in it. An oxide mask 18 is formed over the gate stacks, and TiN layer 16 and polysilicon layer 14 are etched away.

In etching away polysilicon layer 14, it is important that all of polysilicon layer 14 be removed. However, in etching polysilicon layer 14 completely a portion 21 of oxide layer 12 will inevitably be etched. In the etching process, a critical quality attribute is remaining oxide thickness 20 in the source region 22 and drain region 24 which determines the characteristics of these regions. Remaining oxide thickness 20 is a function of the etch time, i.e. the period for which the wafer is exposed to the plasma.

Figure 2:
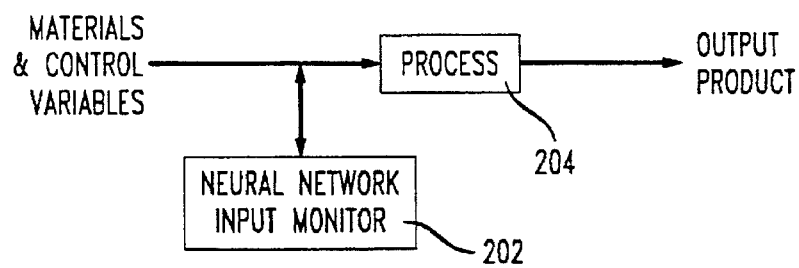
FIG. 2 illustrates a neural network controller which monitors control variables and materials to regulate a manufacturing process.

FIG. 2 presents an illustrative embodiment of the present invention in which a neural network is advantageously incorporated into process monitor 202 which regulates or governs the control variables input into process 204 to shut the process off when the process reaches endpoint. Section II presents an illustrative embodiment of the invention in which more than one process signature of the plasma etch process is monitored by the neural network. Based upon the information the neural network contains as a result of being trained, the neural network analyzes the various process signatures during the process. When the neural network observes a condition, or a set of conditions, that it associates with endpoint, the neural network sends a message to the process that tells the process to stop etching. An overview of neural network operation and the preferred training technique are not discussed in detail herein, because one skilled in the art is familiar with how to train and use neural networks.

II. A Neural Network Controller

A trace or record may generally be defined as a measurement over time of a specific variable or function. In the preferred embodiment a portion of the trace of at least two of the electrical parameters associated with the RF power used to generate the plasma, i.e., capacitance, DC bias, voltage, current, and the like are used as process signatures. A process signature reflects, or has embedded in it, information related to quality attributes and to the process itself as well as information about factors which make the process difficult to control. The RF electrical parameter traces contain information related to the chemistry of the plasma and information regarding the concentration of the material etched away. The traces of these electrical parameters are analyzed by a neural network in real time. The neural network, previously trained to recognize a particular condition or set of conditions as an indication that the process has reached endpoint, is used to shut off the process when the requisite condition. or set of conditions, is observed. See W. T. Miller, R. S. Sutton and P. J. Werbos, *Neural Networks for Control*, MIT Press, Cambridge, Mass. (1990) for a collection of papers on neural networks for control.

Other process signatures may also be identified and used to train a neural network and to control a process. In some cases, for example, traces of the input control variables and materials, such as temperature, pressure, etc., may be process signatures. Optical emission traces of the plasma itself can also be used.

Figure 3:
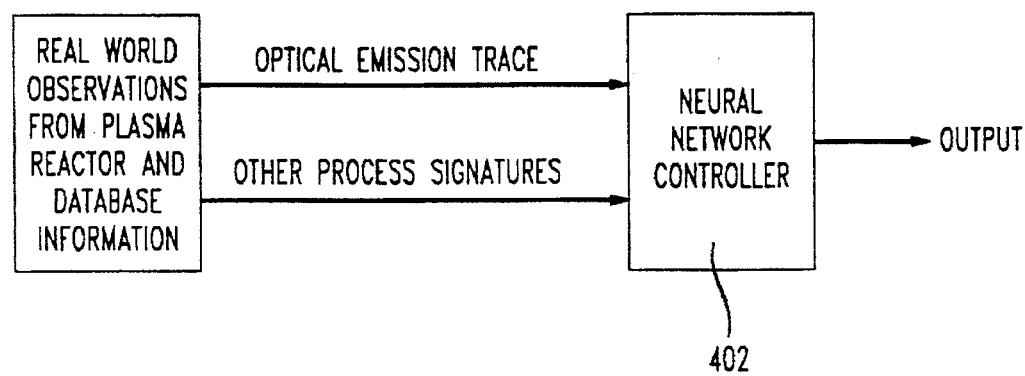
FIG. 3 illustrates a block diagram system for training a neural network.

FIG. 3 is an illustrative diagram of the method of training the neural network. In the preferred embodiment, the neural network 402 is a 12×4×1 architecture (i.e. 12 input nodes, 4 hidden nodes and 1 output node) and trained with the back-propagation technique (see Section III below). Results from a production database may be used for the training. As illustrated by the example provided below, the process is used to determine the endpoint of the process by observing traces of process parameters during the etch of numerous wafers correlating certain parameters with process endpoint, and using a neural network to monitor processes to detect process endpoint.

EXAMPLE

Titanium nitride (TiN)/polysilicon gate stacks depicted generally in FIG. 1 were etched in a high-density plasma reactor. The wafer stacks consisted of a silicon wafer on which were a 70 Å-thick layer of gate oxide, a 2000 Å-thick layer of polysilicon, a 1000 Å-thick layer of titanium nitride, over which was formed a silicon oxide mask with a thickness of about 1500 Å to about 2000 Å. The process used to etch these gate stacks is described in detail in N. Blayo, R. A. Cirelli, F. P. Klemens, and J. T. C. Lee, "Ultraviolet-Visible Ellipsometry for Process Control During the Etching of Submicron Features," *J. Optical Society of America* 12(3), pp. 591–599 (1995). The plasma etcher used was a high density plasma source, Lucas Labs Model 001 obtained from Lucas Labs of Sunnyvale, Calif. RF power at 13.56 MHz from an Advanced Energy RFX-2500 source was coupled into the source chamber via an antenna using a Matchpro CPM-2000 automatic matching network obtained from Comdel, Inc. of Beverly, Mass. The wafers in the chamber were RF-biased through an Advanced Energy RFX–600 source and a Matchwork 5 Controller matching network obtained from ENI of Santa Clara, Calif.

In total, 55 wafers were etched under the described conditions. The time required to etch the TiN layer on each wafer was noted. The data was divided into three lots, each lot having a different average etch time. The mason for the difference in average etch time is unknown, but may be due to differences in pattern density or initial film thickness.

During the etching of each wafer, several different process conditions were monitored in real-time. Optical emission spectroscopy (OES) data were recorded by a Model 600 Optical Spectrum Analyzer (Monolite Instruments of Leonminster, Mass.). The process was controlled by an operator monitoring the $\Psi$ and $\Delta$ traces from an in situ UVISEL spectroscopic ellipsometer obtained from Jobin Yvon of France. The ellipsometer was tuned to one wavelength within the range of 2 eV to 4 eV for monitoring each wafer during the plasma etch process. The ellipsometric traces were used to detect the endpoint of the process. Since the wavelength used to obtain the ellipsometric traces varied somewhat from wafer to wafer, not every trace accurately indicated process endpoint. In those instances where the trace did not indicate endpoint, the operator approximated endpoint by the length of the time of the etch.

First, the set of traces that would be used to monitor the process was determined. This was not a necessary step to practice the process, but was required because the neural network that was used could not accept the data from all seven signals that were monitored. Therefore, the signals that provided the greatest indication of endpoint were selected using the following method. The seven signal traces were of the reflected source power, reflected chuck power, source match load, source match tune, RF-bias match load, RF-bias match tune, and DC bias. The traces were examined to determine the value of a signal at endpoint. This value was compared with the value of the signal at a time that was, on the average, 8 seconds before endpoint.

A metric was then developed to determine which of the signals $x_i$ would be useful to detect endpoint. The metric used was the ratio of the mean differences between the value of a signal at endpoint and the value of a signal at time t prior to endpoint. The ratio was normalized by its standard deviation using the following equations:

$$\frac{|\overline{\Delta x_i}|}{\sigma_i} \quad (1)$$

where $$\Delta x_i = \frac{1}{n} \sum_{j=1}^{N\text{files}} (x_{ij}^{endpoint} - x_{ij}^{\Delta t}) \quad (2)$$

and $$\sigma_i^2 = \frac{1}{N-1} \sum_{j=1}^{N\text{files}} (x_{ij}^{endpoint} - x_{ij}^{\Delta t} - \overline{\Delta x_x})^2 \quad (3)$$

wherein N was the number of wafers and j was the index of the wafer number.

A score was then assigned to each Δt by summation of Equation (1) over all of the RF signals:

$$\sum_{i=1}^{7 \text{ signals}} \frac{|\overline{\Delta x_i}|}{\sigma_i} \quad (4)$$

A graph of this scoring function illustrated that a higher Δt was a better endpoint predictor than a lower Δt. However, from a processing standpoint, a lower Δt is desired. By evaluating the increase in total score as a function of increase in time, the actual incremental benefit for each increase in Δt was determined. Based on this analysis, it was determined that the process endpoint could be readily detected by comparing values of the parameters at 8 or 9 seconds prior to endpoint with the values at endpoint.

Table 1 below illustrates the score of each of the signals evaluated.

TABLE 1

| Signal | Mean (ΔX̄) | Sigma (σ) | $|\Delta x_i|/\sigma$ |
|---|---|---|---|
| Reflected source power | 1.92727 | 0.17734 | 10.86755 |
| Reflected chuck power | 0.63636 | 0.46360 | 1.37265 |
| Source match load | 0.25455 | 0.02295 | 11.08935 |
| Source match tune | 0.00182 | 0.00320 | 0.56848 |
| RF-bias match load | 1.69091 | 0.35897 | 4.71050 |
| RF-bias match tune | −0.56364 | 0.09716 | 5.80111 |
| DC bias | 0.10909 | 0.08556 | 1.27505 |

Figure 4:
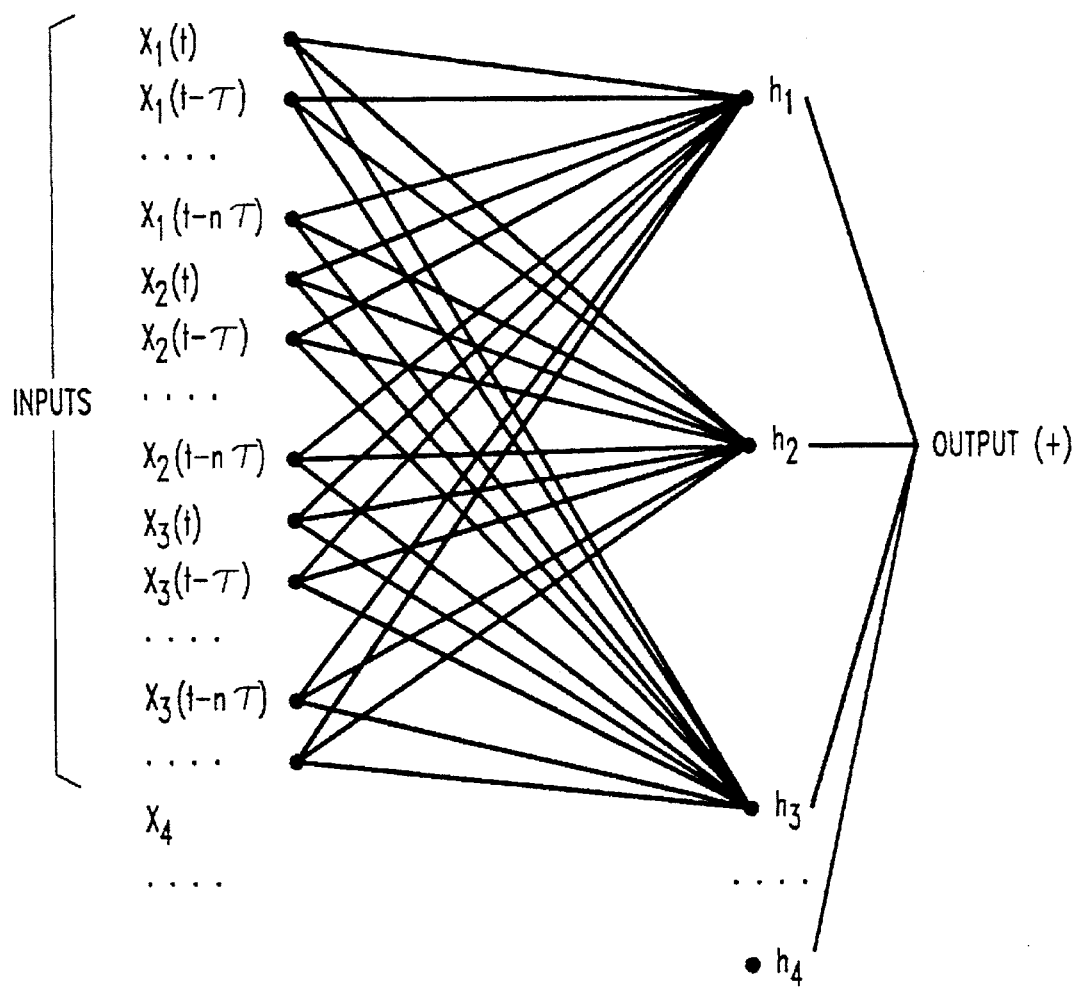
FIG. 4 is a schematic representation of a neural network used to practice the process of the present invention.

The four signals that exhibited the most significant change at endpoint (reflected source power, source match load, RF-bias match load and RF-bias tune) were used to train the neural network. A fully-connected feed-forward neural network was implemented using an input layer, one hidden layer, and a one-node output layer. The network is illustrated generally in FIG. 4. The output of the network was "1" if it was at endpoint and "0" otherwise. The input to the neural network included the n+1 values of each of the four electrical parameters enumerated above. These values were the value at time t, at time-τ, and at time t-2τ to t-nτ, where the timestep τ is generally one second and the number of timesteps, n, is typically one or two. The input layer had either 8 or 12 nodes. The input layer with 8 nodes accepted four inputs at two different times for each signal. The input layer with 12 nodes accepted four inputs at three different times.

The traces of the values of the 4 parameters enumerated above were divided into two sets, a training test and a testing set. The testing set was about 10 percent of the available data obtained from testing. The endpoint was determined by a human operator observing the output of an ellipsometer as described above. The data were normalized by using the following standard equation to change the data to values in the range of −1 to 1:

$$\hat{x}_i = \frac{x_i - \overline{x}_i}{\sigma_i} \quad (5)$$

The neural networks were then trained using a conventional backpropagation algorithm, in which the values were updated as more traces were fed into the neural network. The test data set was then provided to the network, and the output (i.e., whether or not the process had reached endpoint) was compared with the known answer.

A neural network trained according to the process of the present invention is useful for controlling a process similar to the process evaluated to train the network then it is probably necessary to retrain the neural network. For example, if a process parameter is adjusted more than 10 percent from the value of the parameter that was used in the process monitored to train the network, the network should be retrained to reliably detect endpoint for the modified process.

There are various methods to improve the neural network learning performance. See J. Denker et al, "Large Automatic Learning, Rule Extraction, an Generalization," *Complex Systems*, Vol. 1,877–922 (1987). The most common is to adjust the complexity of the network. But there is a trade-off in the complexity and the error. A network that is too complex will essentially build a lookup table with the training data and perform poorly on testing data. The network in the example embodiment has been optimized for a minimum complexity and while still achieving a low error. It should also be apparent that as the amount of training data increases the testing error should decrease. Thus, a tighter process control over the oxide thickness remaining after the plasma etch may be expected.

The invention claimed is:

1. A method for using a neural network to detect the endpoint of a plasma etch process comprising:

a. identifying a plurality of process signatures wherein at least one of said process signatures, either alone or in combination with other process signatures, indicates the endpoint of the plasma etch process;

b. measuring said plurality of process signatures to form a record associating the process signatures with process endpoint using a neural network;

c. monitoring the plurality of process signatures and using the neural network to compare the monitored process signatures with the record to determine whether or not the plasma etch process has reached endpoint.

2. The method of claim 1 wherein said neural network is trained with measurements of said set of one or more process signatures and with prior data of said process signature.

3. The method of claim 1 wherein said neural network is trained with the back-propagation technique.

4. The method of claim 1 wherein the process signatures are selected from the group consisting of plasma diagnostics, wafer diagnostics, and tool diagnostics.

5. The method of claim 4 wherein the process signatures are selected from the group consisting of reflected source power, reflected chuck power, source match load, source match tune, RF-bias match load, RF-bias match tune, and DC bias.

* * * * *